(12) United States Patent
Chung et al.

(10) Patent No.: US 11,398,557 B2
(45) Date of Patent: Jul. 26, 2022

(54) SEMICONDUCTOR DEVICE

(71) Applicant: VANGUARD INTERNATIONAL SEMICONDUCTOR CORPORATION, Hsinchu (TW)

(72) Inventors: Yi-Ching Chung, Hsinchu (TW); Jui-Chun Chang, Hsinchu (TW); Fu-Chun Tseng, Taipei (TW); Yu-Ping Ho, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/996,450

(22) Filed: Aug. 18, 2020

(65) Prior Publication Data

US 2022/0059662 A1 Feb. 24, 2022

(51) Int. Cl.
*H01L 29/40* (2006.01)
*H01L 29/06* (2006.01)
*H01L 29/423* (2006.01)

(52) U.S. Cl.
CPC ........ *H01L 29/402* (2013.01); *H01L 29/0615* (2013.01); *H01L 29/0653* (2013.01); *H01L 29/42312* (2013.01)

(58) Field of Classification Search
CPC ............. H01L 29/402; H01L 29/42312; H01L 29/0615; H01L 29/0653
See application file for complete search history.

(56) References Cited

U.S. PATENT DOCUMENTS

| 6,110,831 | A | * | 8/2000 | Cargo | B24B 37/013 438/692 |
| 8,587,073 | B2 | * | 11/2013 | Cheng | H01L 23/5228 257/360 |
| 8,629,513 | B2 | * | 1/2014 | Su | H01L 29/404 257/409 |
| 2013/0032862 | A1 | * | 2/2013 | Su | H01L 29/405 257/272 |
| 2013/0093010 | A1 | * | 4/2013 | Huang | H01L 29/7816 257/335 |
| 2013/0277741 | A1 | * | 10/2013 | Guowei | H01L 29/7835 257/343 |
| 2015/0008539 | A1 | * | 1/2015 | Kanda | H01L 21/761 257/409 |
| 2017/0025532 | A1 | * | 1/2017 | Mori | H01L 29/7835 |
| 2017/0104097 | A1 | * | 4/2017 | Park | H01L 29/7835 |
| 2018/0033854 | A1 | * | 2/2018 | Kaya | H01L 29/7823 |

(Continued)

*Primary Examiner* — Eugene Lee
(74) *Attorney, Agent, or Firm* — Birch, Stewart, Kolasch & Birch, LLP

(57) ABSTRACT

A semiconductor device is provided. The semiconductor device includes a substrate, a first well, a second well, an isolation structure, a first field plate, a gate structure, a drain structure, and a source structure. The first well and the second well adjoin each other. The first well and the second well are disposed in the substrate. The isolation structure is disposed on the first well. The first field plate is disposed on the isolation structure. The gate structure crosses the first well and the second well, and an opening is defined between the first field plate and the gate structure to expose an edge of the isolation structure adjacent to the gate structure. The drain structure is disposed in the first well. The source structure is disposed in the second well.

19 Claims, 8 Drawing Sheets

(56) References Cited

U.S. PATENT DOCUMENTS

| | | | |
|---|---|---|---|
| 2019/0131296 A1* | 5/2019 | Murukesan | H01L 27/0629 |
| 2019/0259751 A1* | 8/2019 | Pala | H01L 21/823418 |
| 2019/0267455 A1* | 8/2019 | Lin | H01L 29/1083 |
| 2019/0280089 A1* | 9/2019 | Bunin | H01L 29/0649 |
| 2019/0288066 A1* | 9/2019 | Lee | H01L 29/7835 |
| 2020/0075759 A1* | 3/2020 | Pala | H01L 29/1095 |
| 2020/0126990 A1* | 4/2020 | Zhang | H01L 21/823878 |
| 2020/0195248 A1* | 6/2020 | Yang | H01L 29/0619 |
| 2021/0074852 A1* | 3/2021 | Ikeura | H01L 23/528 |
| 2021/0104630 A1* | 4/2021 | Chung | H01L 29/0886 |

* cited by examiner

SEMICONDUCTOR DEVICE

BACKGROUND

Field of the Disclosure

The present disclosure relates to a semiconductor device, and in particular, to a semiconductor device with field plate.

Description of the Related Art

Semiconductor devices can be applied in various fields, such as display driver ICs, power management ICs (or high-power power management ICs), discrete power devices, sensing devices, fingerprint sensor ICs, memories, and so on. Semiconductor devices are typically manufactured in the following manner: sequentially depositing an insulation or dielectric layer, a conductive layer, and a semiconductor material layer on a semiconductor substrate, and patterning the various material layers by using lithography technique to forming circuit components and elements thereon.

The gate is generally extended over other features (e.g. a drift region or an isolation structure) to function as a field plate. This is done for improving the breakdown voltage of semiconductor devices, in addition to optimizing the well and the drift regions between the source and the drain. Although existing gate field plates are generally adequate for their intended purpose, they are not satisfactory in all aspects.

SUMMARY

An embodiment of the present disclosure provides a semiconductor device, which includes a substrate, a first well, a second well, an isolation structure, a first field plate, a gate structure, a drain structure, and a source structure. The first well and the second well adjoin each other. The first well and the second well are disposed in the substrate. The isolation structure is disposed on the first well. The first field plate is disposed on the isolation structure. The gate structure crosses the first well and the second well, and an opening is defined between the first field plate and the gate structure to expose an edge of the isolation structure adjacent to the gate structure. The drain structure is disposed in the first well. The source structure is disposed in the second well.

BRIEF DESCRIPTION OF THE DRAWINGS

The embodiments of the disclosure can be more fully understood by reading the subsequent detailed description and examples with references made to the accompanying drawings. In accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
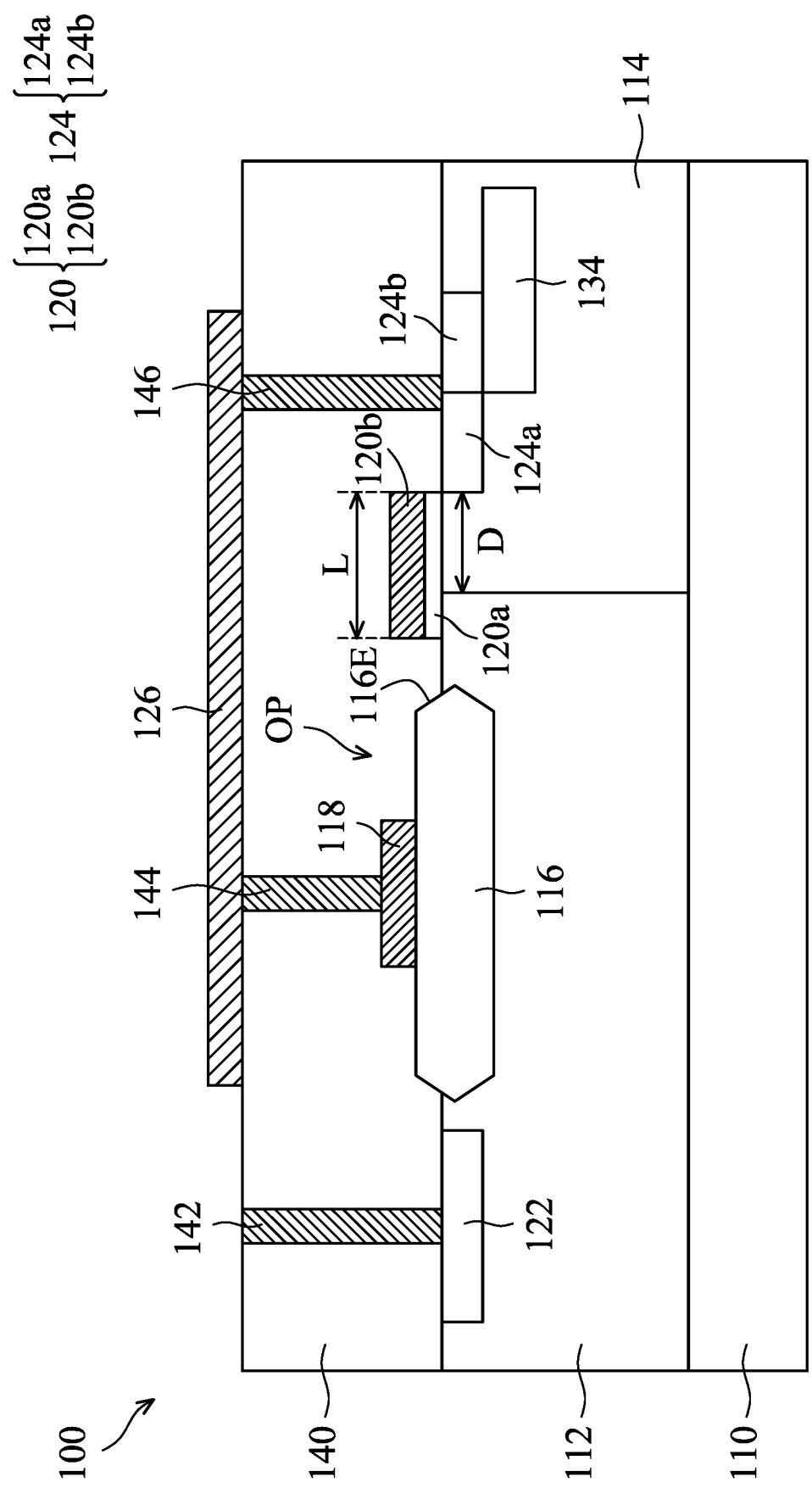
FIGS. 1-8 illustrate cross-sectional views of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Additionally, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise. In addition, the term "coupled" include any method of direct and indirect electrical connection.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about", "approximately", and "roughly" typically mean 20% of the stated value, or +10% of the stated value, or +5% of the stated value, or +3% of the stated value, or +2% of the stated value, or +1% of the stated value, or +0.5% of the stated value. The stated value of the present disclosure is an approximate value. When there is no specific description, the stated value includes the meaning of "about", "approximately", and "roughly".

Some embodiments of the disclosure are described below. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Impact ionization points of a semiconductor device usually occur in an isolation structure (e.g. a shallow trench isolation (STI) structure or a local oxidation of silicon (LOCOS) structure) adjacent to a source structure. The electron-hole pairs generated from impact ionization points may be injected into adjacent features due to the electric field in the semiconductor device, resulting in hot carrier injection (HCI) that affects the reliability of the semiconductor device. The above description is only one of the purposes of the present disclosure and it is not intended to limit the scope of present disclosure.

A semiconductor device is provided in embodiments of the present disclosure. The field plate on the isolation structure of the semiconductor device may not extend to the edge of the isolation structure, and the gate structure may not extend to the isolation structure. In other words, an opening is defined between the field plate on the isolation structure and the gate structure to expose the edge of the isolation structure and reduce the intensity of electric field at the impact ionization points near the isolation structure, and thereby hot carrier effect may be reduced or prevented.

For illustration purpose, the present disclosure is described as a laterally diffused metal oxide semiconductor (LDMOS) device, and examples of applying the present disclosure to other devices (e.g. lateral insulated gate bipolar transistor (LIGBT)) are also described. However, the present disclosure is not limited thereto. Embodiments of the present disclosure are also applicable to other types of metal oxide semiconductor devices, such as a vertically diffused metal oxide semiconductor (VDMOS) device, an extended-drain metal oxide semiconductor (EDMOS) device or the like. In addition, the present disclosure is also applicable to other types of semiconductor devices, such as a diode, an insulated gate bipolar transistor (IGBT), a bipolar junction transistor (BJT) or the like.

Referring to FIG. 1, a cross-sectional view of the semiconductor device 100 is illustrated in accordance with some embodiments of the present disclosure. The semiconductor structure 100 includes a substrate 110, a first well 112, a second well 114, an isolation structure 116, a field plate 118, a gate structure 120, an opening OP, a drain structure 122, a source structure 124, a field plate 126, an interlayer dielectric layer 140, a drain contact 142, a field plate contact 144, and a source contact 146. The substrate 110 may be doped (such as doped with a p-type or an n-type dopant) or undoped semiconductor substrate. For example, the substrate 110 may include an elemental semiconductor including silicon or germanium; a compound semiconductor including gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP, or a combination thereof.

In some embodiments, the substrate 110 may be a semiconductor-on-insulator substrate, such as a silicon-on-insulator substrate or a silicon germanium-on-insulator (SGOI) substrate. In other embodiments, the substrate 110 may be a ceramic substrate, such as an aluminum nitride (AlN) substrate, a silicon carbide (SiC) substrate, an alumina ($Al_2O_3$) substrate (or referred as a sapphire substrate), or other substrate. In other embodiments, the substrate 110 may include a ceramic substrate and a pair of blocking layers disposed on the upper and lower surfaces of the ceramic substrate respectively. The material of the ceramic substrate may include a ceramic material, and the ceramic material includes an inorganic metal material. For example, the ceramic substrate may include silicon carbide, aluminum nitride, sapphire substrate, or other suitable materials. The sapphire substrate may be alumina.

The first well 112 is disposed in the substrate 110. The method of forming the first well 112 includes (but is not limited to): forming a patterned mask layer (not shown) on the substrate 110 by using a lithography process and an etching process, where the patterned mask exposes the predetermined region where the first well 112 is to be formed and covers other regions of the substrate 110; implanting dopants to the predetermined region where the first well 112 is to be formed; and removing the patterned mask layer. The patterned mask layer may be a hard mask or a photoresist. In embodiments where an n-type first well 112 is to be formed, the dopants may be n-type dopants, such as phosphorus, arsenic, or antimony ions. In embodiments where a p-type first well 112 is to be formed, the dopants may be p-type dopants, such as boron, indium, or $BF_2^+$ ions.

The second well 114 is disposed in the substrate 110 and adjoins the first well 112. The method of forming the second well 114 is similar to the method of forming the first well 112 described above. In embodiments of the present disclosure, the second well 114 and the first well 112 have opposite conductivity types. For example, in the embodiments where the first well 112 is n-type, the dopants for implanting the second well 114 are p-type dopants (e.g. boron, indium, or $BF_2^+$ ions) in order to form the p-type second well 114; in the embodiments where the first well 112 is p-type, the dopants for implanting the second well 114 are n-type dopants (e.g. phosphorus, arsenic, or antimony ions) in order to form the n-type second well 114.

In some embodiments, the first well 112 has a first conductivity type and the second well 114 has a second conductivity type opposite to the first conductivity type. Alternatively, the first well 112 has the second conductivity type and the second well 114 has the first conductivity type. Specifically, in some embodiments, the first well 112 may be a p-type well and the second well 114 may be an n-type well to serve as an n-type metal-oxide-semiconductor field-effect transistor (NMOS). In some embodiments, the first well 112 may be an n-type well and the second well 114 may be a p-type well to serve as a p-type metal-oxide-semiconductor field-effect transistor (PMOS). In some embodiments, the doping concentration of the first well 112 is between about $1 \times 10^{10}$ cm$^{-3}$ and $1 \times 10^{20}$ cm$^{-3}$. The doping concentration of the second well 114 is between about $1 \times 10^{10}$ cm$^{-3}$ and $1 \times 10^{20}$ cm$^{-3}$.

The isolation structure 116 is disposed on the first well 112. The isolation structure 116 may include shallow trench isolation (STI), local oxidation of silicon (LOCOS), or a combination thereof. In some embodiments, the process of forming the shallow trench isolation includes forming a mask layer (not shown) on the first well 112 and patterning the mask layer, etching a trench (or trenches) in the substrate by using the patterned mask layer as an etch mask, performing a deposition process to fill an isolation material into the trench (or trenches), and performing a planarization process, such as a chemical mechanical polishing (CMP) process or a mechanical grinding process to remove the excess portion of the isolation material. In some embodiments, the isolation structure 116 is disposed on the substrate 110. The isolation material may include oxide, nitride, or oxynitride, such as silicon oxide ($SiO_2$), carbon-doped silicon oxide ($SiO_xC$), silicon oxy-nitride (SiON), silicon-oxy-carbon nitride (SiOCN), silicon carbide (SiC), silicon carbon nitride (SiCN), silicon nitride ($Si_xN_y$, or SiN), silicon-oxycarbide (SiCO), any other suitable material, or any combination thereof. In some embodiments, the process of local oxidation of silicon for forming the isolation structure 116 may include depositing a mask layer (e.g. silicon nitride layer) on the first well 112 on, patterning the mask layer by using a lithography process and an etching process to expose a portion of the first well 112, thermally oxidizing the exposed portion of the first well 112 to form a silicon oxide layer, and removing the patterned mask layer.

The field plate 118 is disposed on the isolation structure 116. In some embodiments, the field plate 118 has the effect of reduced surface electric field (REduced SURface Field, RESURF) and may reduce the intensity of the electric field electric near and at the impact ionization points of the isolation structure 116. The material of the field plate 118 may include a conductive material, such as metal, metal nitride, or doped semiconductor. For example, the metal may include Au, Ni, Pt, Pd, Ir, Ti, Cr, W, Al, Cu, other suitable material, a combination thereof, or multiple layers thereof; the metal nitride may include MoN, WN, TiN, TaN, or other suitable materials; the doped semiconductor may include doped polycrystalline silicon or doped polycrystalline germanium. The conductive material may be formed by a deposition process, such as chemical vapor deposition (CVD), atomic layer deposition (ALD), or physical vapor deposition (PVD) (e.g. sputtering or evaporation), and then the conductive material is patterned to form the field plate 118.

Referring to FIG. 1, the gate structure 120 crosses the first well 112 and the second well 114, and an opening OP is defined between the field plate 118 and gate structure 120 to expose the corner 116E of the isolation structure 116 adjacent to the gate structure 120. In some embodiments, the gate structure 120 may include the gate dielectric layer 120a disposed on the first well 112 and/or the second well 114, and the gate electrode 120b disposed on the gate dielectric layer 120a. In a conventional semiconductor device, the electron-hole pairs generated from impact ionization points at the corner of the isolation structure may gain sufficient kinetic energy by the vertical electric field to overcome the potential barrier, such that the electron-hole pairs may be injected into the overlying feature(s) (e.g. the gate structure), resulting in severe hot carrier injection that reduces the reliability or lifetime of the device. According to some embodiments of the present disclosure, the corner 116E of the isolation structure 116 adjacent to the gate structure 120 is exposed through the opening OP between the field plate 118 and gate structure 120, which may effectively reduce the damage of the semiconductor structure caused by the hot carrier injection and improve the reliability of the device. The above description is only one of the purposes of the present disclosure and it is not intended to limit the scope of present disclosure.

In some embodiments, a method for forming the gate structure 120 includes sequentially depositing a blanket dielectric material layer (for forming the gate dielectric layer 120a) and a blanket conductive material (for forming the gate electrode 120b) on the dielectric material layer, and then patterning the dielectric material layer and the conductive material layer respectively by lithography and etch processes to form the gate dielectric layer 120a and the gate electrode 120b crossing the first well 112 and the second well 114. In some embodiments as shown in FIG. 1, in a direction from the source structure 124 to the isolation structure 116, the length L of the gate structure 120 is greater than the distance D between the source structure 124 and the first well 112 to ensure the device may function normally. If the length L is less than the distance D, the channel may not be turned on. Gate dielectric layer 120a may include a single or multiple layers of one or more dielectric materials, such as silicon oxide, silicon nitride, silicon oxynitride, or a combination thereof. In other embodiments, the gate dielectric layer 120a may include (but is not limited to) metal oxide, metal nitride, metal silicide, metal aluminate, zirconium silicate, zirconium aluminate, or a combination thereof. The gate dielectric layer 120a may be formed by, for example, spin-coating, chemical vapor deposition, atomic layer deposition, high-density plasma chemical vapor deposition, other suitable method, or a combination thereof. The material and method of forming the gate electrode 120b may be the same as or similar to those of the field plate 118, and the gate electrode 120b and the field plate 118 may be formed in the same deposition and lithography process, or in different processes.

In embodiments where the gate electrode 120b and the field plate 118 are formed in the same process, the process may include forming a conductive material by a deposition process, such as chemical vapor deposition, atomic layer deposition, or physical vapor deposition (e.g. sputtering or evaporation), and then patterning the conductive material to form the field plate 118 on the isolation structure 116, the gate electrode 120b crossing the first well 112 and the second well 114, and the opening OP exposing the corner 116E of the isolation structure 116 adjacent to the gate structure 120, as shown in FIG. 1. In some embodiments, the opening OP may expose both the corner 116E of the isolation structure 116 and a portion of the first well 112 to further reduce the probability of the electron-hole pairs being injected into the overlying gate structure 120 or the field plate 118 due to the effect of the electric field and ensure the reduction of the hot carrier effect.

The drain structure 122 is disposed in the first well 112 and the source structure 124 is disposed in the second well 114 in. The drain structure 122 may include a doped region having the same conductivity type as the first well 112. The source structure 124 may include the doped region 124a and the doped region 124b adjoining each other and having opposite conductivity types. The method of forming the doped regions of the drain structure 122 and the source structure 124 is similar to the method of doping the first well 112 described above. In some embodiments, the semiconductor device 100 further includes a doped region 134 disposed below the source structure 124, where the doping concentration of the doped region 124b is greater than the doping concentration of the doped region 134. In one embodiment, the doping concentration of the source structure 124, the doped region 124a, or the doped region 124b is between about $10^{13}$ cm$^{-3}$ to $10^{21}$ cm$^{-3}$, the doping concentration of the doped region 134 is between about $10^{12}$ cm$^{-3}$ to $10^{13}$ cm$^{-3}$, where the doped region 134 may reduce the on-state resistance ($R_{on}$).

Still referring to FIG. 1, the interlayer dielectric layer 140 is disposed on the substrate 110. The interlayer dielectric layer 140 may include a single or multiple layers of one or more dielectric materials, such as silicon oxide, silicon nitride silicon oxynitride, tetraethoxysilane (TEOS), phosphosilicate glass (PSG), borophosphosilicate glass (BPSG), low-k dielectric material, and/or other suitable dielectric material. The low-k dielectric material may include (but is not limited to) fluorinated silica glass (FSG), hydrogen silsesquioxane (HSQ), carbon-doped silicon oxide, amorphous fluorinated carbon, parylene, bis-benzocyclobutenes (BCB), or polyimide. The interlayer dielectric layer 140 may be formed by, for example, spin-coating, chemical vapor deposition, atomic layer deposition, high-density plasma chemical vapor deposition, other suitable method, or a combination thereof.

As shown in FIG. 1, the drain contact 142, the field plate contact 144, and the source contact 146 are configured to penetrate through the interlayer dielectric layer 140 and be electrically connected to the drain structure 122, the field plate 118, and the source structure 124 respectively. The contacts may be formed in the same process, including forming an interlayer dielectric material layer, patterning the interlayer dielectric material layer to form the interlayer dielectric layer 140 having openings, filling a conductive material into the openings, and performing a planarization process (such as chemical mechanical polishing) or an etch back process to remove the excess material outside the openings. The material and method of forming the conductive material may be the same as or similar to those of the field plate 118. In some embodiments, the drain contact 142, the field plate contact 144, and the source contact 146 may be formed of polycrystalline silicon, metal, or other suitable conductive material. In some embodiments, the material of the drain contact 142, the field plate contact 144, and the source contact 146 may include Cu, Al, Mo. W, Au Cr, Ni, Pt, Ti, Ir, Rh, copper alloy, aluminum alloy, molybdenum alloy, tungsten alloy, gold alloy, chromium alloy, nickel alloy, platinum alloy, titanium alloy, iridium alloy, rhodium alloy, other suitable conductive material, or a combination thereof.

Referring to FIG. 1, the field plate 126 is disposed over the field plate 118 and electrically connected to the field plate 118 and the source structure 124 through the field plate contact 144 and the source contact 146 respectively. The field plate 126 spans from the isolation structure 116 exposed through the opening OP to the gate structure 120, which may not only reduce the surface filed, but also reduce the intensity of the electric field below the opening OP (such as the intensity of the electric field near and at the impact ionization points of the isolation structure 116 below the opening OP) and the intensity of the electric field below the gate structure 120. Therefore, the injection of the electron-hole pairs (such as the electron-hole pairs generated from the impact ionization points of the isolation structure 116) (i.e. hot carrier injection) into the gate structure 120 or the field plate 118 due to the electric field may be reduced or prevented to improve the reliability or lifetime of the device without affecting the breakdown voltage of the device. In some embodiments of the present disclosure, the source structure 124 may be connected to a ground terminal. The above description is only one of the purposes of the present disclosure and it is not intended to limit the scope of present disclosure.

One object of the present disclosure is to solve the reduction of reliability or lifetime of devices due to vertical and lateral electric fields. For example, besides the hot carrier injection caused by the vertical electric field as described above, the lateral electric field may also provide the electron-hole pairs (such the electron-hole pairs generated from impact ionization points at the edge of the isolation structure near the gate structure) with sufficient kinetic energy to overcome the potential barrier, such that the electron-hole pairs may be injected into the adjacent feature(s) (e.g. the source structure), resulting in severe hot carrier injection that damages or deteriorates the source structure or the drain structure and reduce the reliability or lifetime of the device. According to some embodiments of the present disclosure, the field plate 126 over the field plate 118 spans from the isolation structure 116 exposed by the opening OP to the gate structure 120 and is electrically connected to the field plate 118 and the source structure 124 such that the field plate 118, the field plate 126, and source structure 124 have the same electric potential. This configuration may not only reduce surface field (i.e. having the RESURF effect), but also reduce the intensity of the lateral electric field near or at the impact ionization points of the isolation structure 116 below the opening OP and the intensity of the lateral electric field below the gate structure 120, such that the injection of the electron-hole pairs (such as the electron-hole pairs generated from the impact ionization points of the isolation structure 116) (i.e. hot carrier injection) into the source structure 124 due to the lateral electric field may be reduced or prevented to improve the reliability or lifetime of the device without affecting the breakdown voltage of the device.

Figure 2:
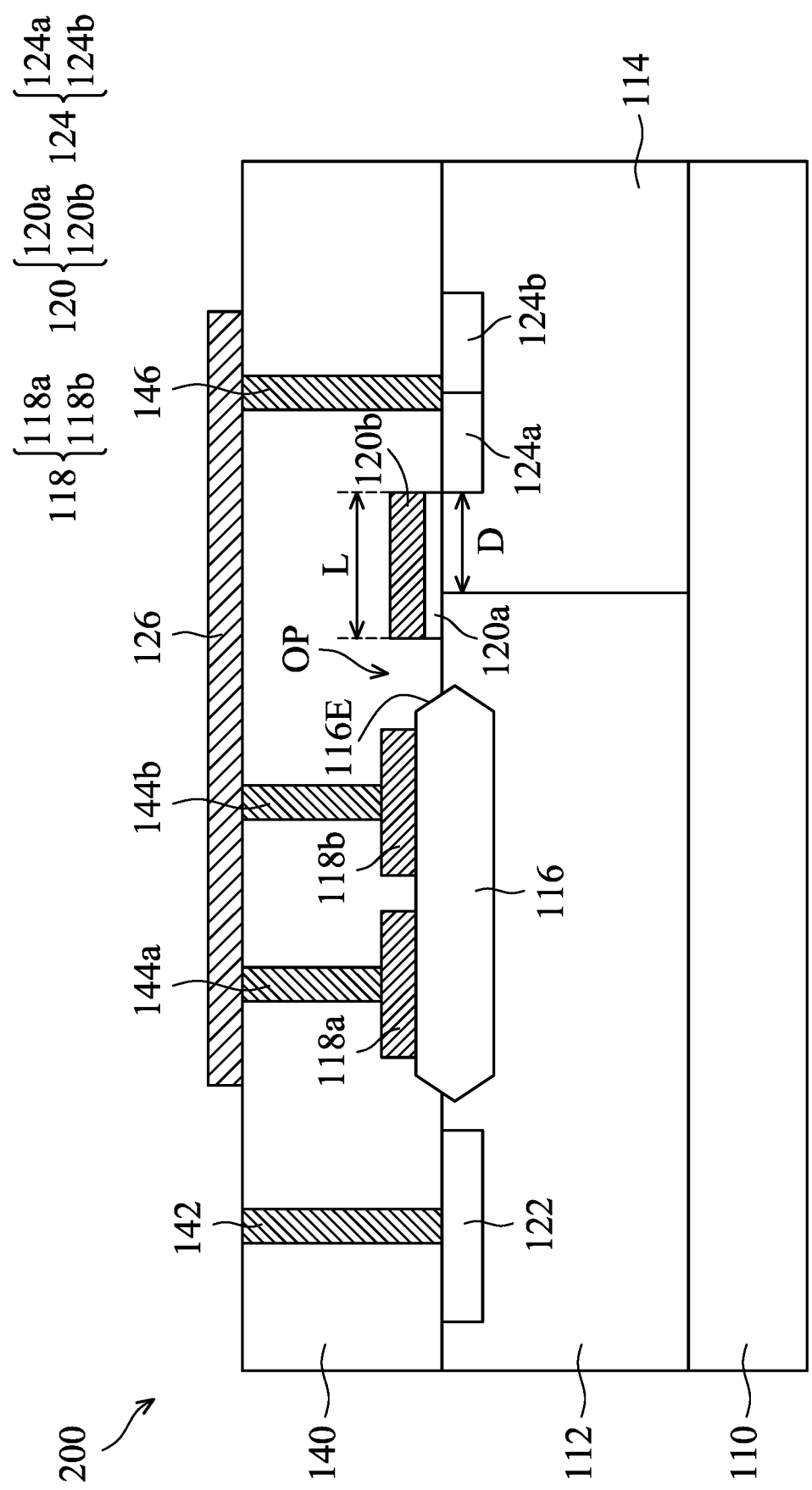

FIG. 2 illustrates a cross-sectional view of the semiconductor device 200, in accordance with some embodiments of the present disclosure. The semiconductor device 200 is similar to the semiconductor device 100 in FIG. 1, except the field plate 118 of the semiconductor device 200 has the first portion 118a and the second portion 118b spaced apart from each other. The first portion 118a and second portion 118b of the field plate 118 are electrically connected to the field plate 126 through the field plate contact 144a and the field plate contact 144b respectively, and a portion of the isolation structure 116 is exposed between the first portion 118a and the second portion 118b. In some embodiments, the field plate 118 having the first portion 118a and the second portion 118b spaced apart from each other may be formed by a patterning process. For simplicity, like features in FIG. 2 and FIG. 1 are designated with like reference numerals and the description is not repeated. The material and method of forming the field plate contacts 144a and 144b may be the same as or similar to those of the field plate contact 144 and not be repeated here.

Like the semiconductor structure 100, the semiconductor structure 200 also includes the opening OP between the field plate 118 and the gate structure 120 such that both the field plate 118 and the gate structure 120 are not located directly above the corner 116E of the isolation structure 116. Therefore, the injection of the electron-hole pairs (such as the electron-hole pairs generated from the impact ionization points) into the overlying features due to the vertical electric field may be reduced or prevented. The semiconductor structure 200 may also include the field plate 126 disposed over the field plate 118. The field plate 126 may not only reduce the surface filed, but further reduce the intensity of the electric field between the isolation structure 116 and the source structure 124 (such as the intensity of the electric field below the opening OP and the gate structure), thereby the injection of the electron-hole pairs (such as the electron-hole pairs generated from the impact ionization points) (i.e. hot carrier injection) into the gate structure 120, the field plate 118, or the source structure 124 may be reduced or prevented to improve the reliability or lifetime of the device. The above description is only one of the purposes of the present disclosure and it is not intended to limit the scope of present disclosure.

In some embodiments, the electrical uniformity of the device may be improved through the field plate 118 having the first portion 118a and the second portion 118b spaced apart from each other in the semiconductor device 200. For example, depending on the design or requirements of the device, the first portion 118a and the second portion 118b spaced apart from each other may be disposed on the isolation structure 116 to reduce the higher local electric field, thereby improving the electrical uniformity of the device. If the distribution of the electric field below portions the isolation structure 116 is not uniform, the first portion 118a and the second portion 118b spaced apart from each other may be disposed directly on the portions of isolation structure 116 to reduce the higher local electric field and thereby improve the electrical uniformity of the device. The number of the portions spaced apart from each other of the field plate 118 is not limited in the embodiments of the present disclosure. The first portion 118a and the second portion 118b in FIG. 2 are merely for example and those skilled in the art may adjust the number or spacing of the portions spaced apart from each other according to actual conditions. If the local electric field is too high while a single field plate is being used, field plates that are spaced apart from each other may be used to improve the uniformity of the electric field, and thereby the electrical uniformity and reliability of the device may be improved.

Figure 3:
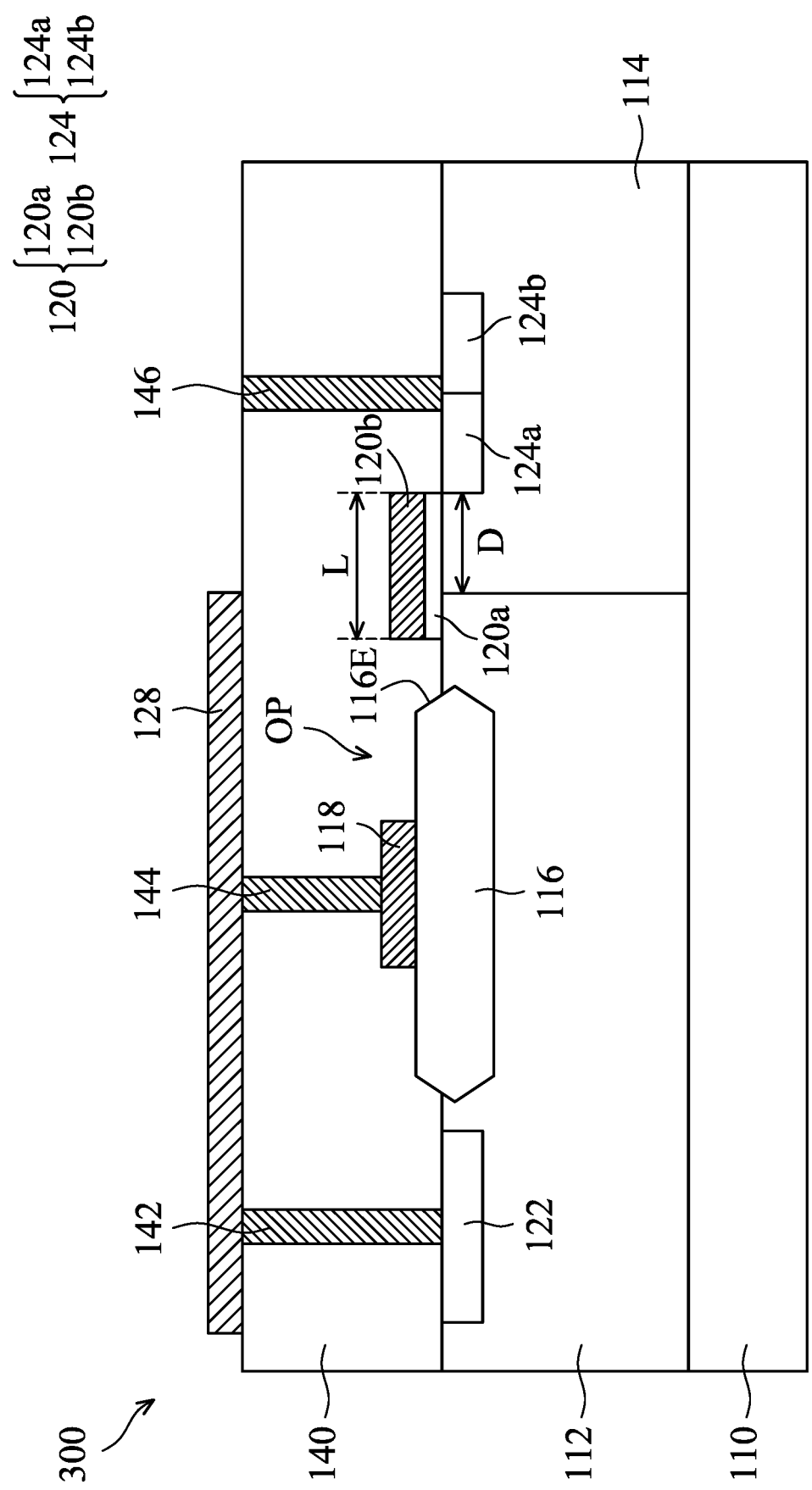

FIG. 3 illustrates a cross-sectional view of the semiconductor device 300, in accordance with some embodiments of the present disclosure. The semiconductor device 300 is similar to the semiconductor device 100 in FIG. 1, except for the semiconductor device 300 has the field plate 128 over field plate 118 and electrically connected to the field plate 118 and the drain structure 122 through the field plate contact 144 and the drain contact 142 respectively. For simplicity, like features in FIG. 3 and FIG. 1 are designated with like reference numerals and the description is not repeated.

Figure 4:
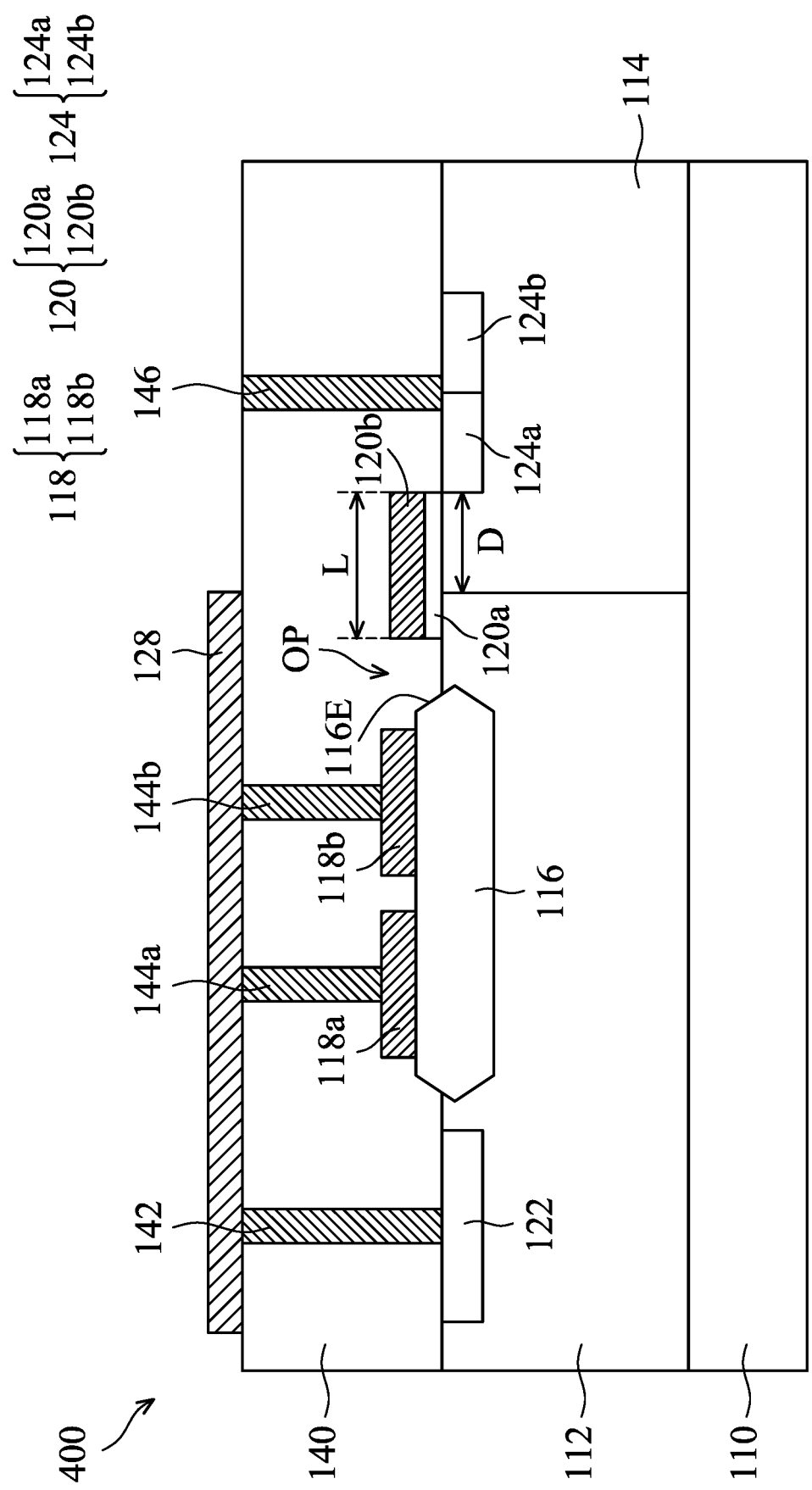

FIG. 4 illustrates a cross-sectional view of the semiconductor device 400, in accordance with some embodiments of the present disclosure. The semiconductor device 400 is similar to the semiconductor device 300 in FIG. 3, except the field plate 118 of the semiconductor device 400 has the first portion 118a and the second portion 118b spaced apart from each other. The first portion 118a and second portion 118b of the field plate 118 are electrically connected to the field plate 128 through the field plate contact 144a and the field plate contact 144b respectively, and a portion of the isolation structure 116 is exposed between the first portion 118a and the second portion 118b. In some embodiments, the field plate 118 having the first portion 118a and the second portion 118b spaced apart from each other may be formed by a patterning process. For simplicity, like features in FIG. 4 and FIG. 3 are designated with like reference numerals and the description is not repeated. The number of the portions spaced apart from each other of the field plate 118 is not limited in the embodiments of the present disclosure and those skilled in the art may adjust the number according to actual conditions.

Figure 5:
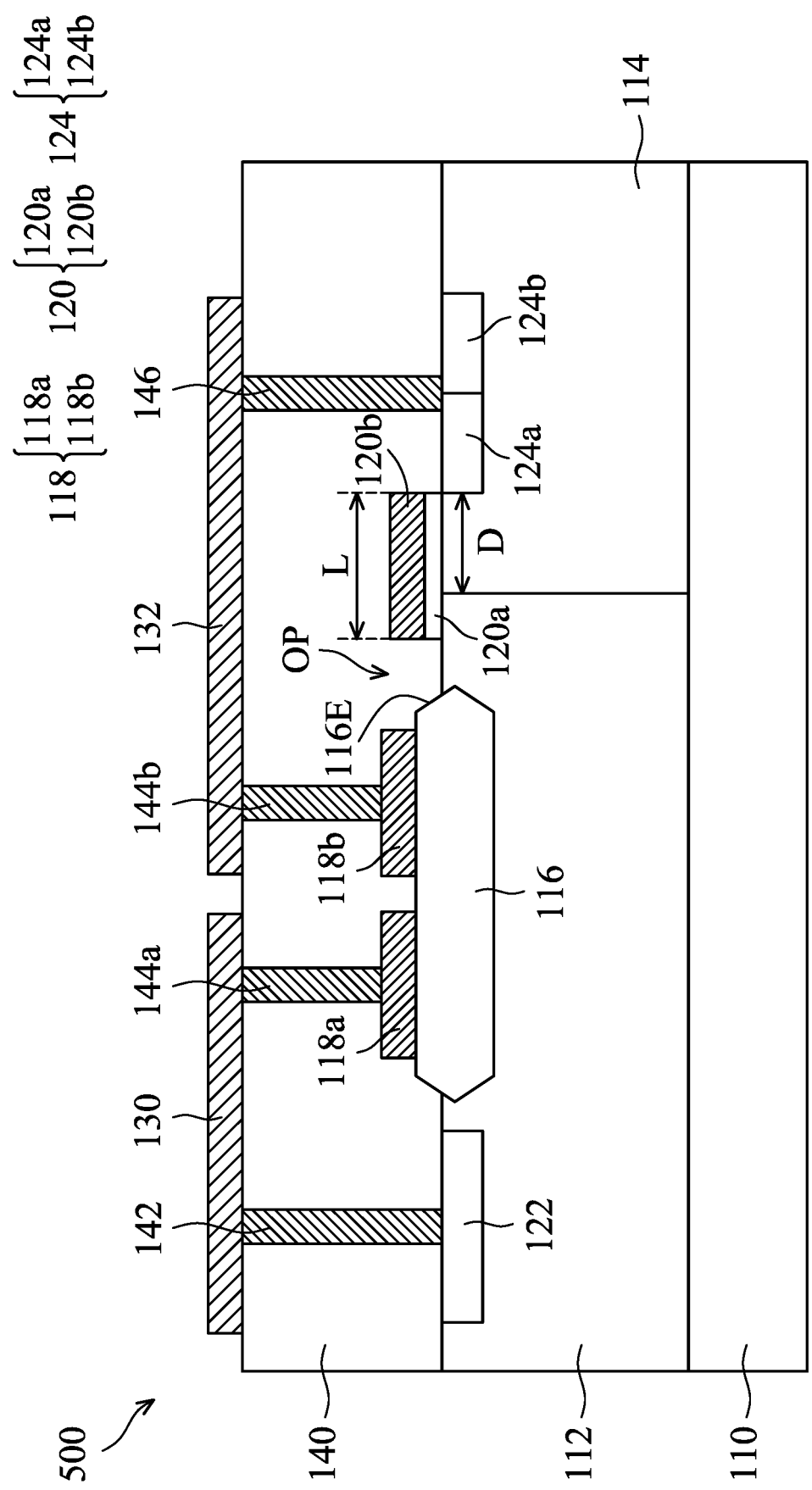

FIG. 5 illustrates a cross-sectional view of the semiconductor device 500, in accordance with some embodiments of the present disclosure. The field plate 118 of the semiconductor device 500 has the first portion 118a and the second portion 118b spaced apart from each other, and a portion of the isolation structure 116 is exposed between the first portion 118a and the second portion 118b. For simplicity, like features in FIG. 5 and figures described above are designated with like reference numerals and the description is not repeated. As shown in FIG. 5, the field plate 130 is disposed on the field plate 118 and electrically connected to the first portion 118a of the field plate 118 and the drain structure 122 through the field plate contact 144a and the drain contact 142 respectively. The field plate 132 is disposed on the field plate 118 and electrically connected to the second portion 118b of the field plate 118 and the source structure 124 through the field plate contact 144b and the source contact 146 respectively. In some embodiments as shown in FIG. 5, in a direction from the source structure 124 to the isolation structure 116, the length L of the gate structure 120 is greater than the distance D between the source structure 124 and the first well 112 to ensure the device may function normally. If the length L is less than the distance D, the channel may not be turned on.

In some embodiments as shown in FIG. 5, the field plate 130 spans over the region between the drain structure 122 and the isolation 116 such that the electric field between the drain structure 122 and the isolation 116 may be reduced. Therefore, the injection of the electron-hole pairs (such as the electron-hole pairs generated from the impact ionization points of the isolation structure 116) into the source structure 124 due to the electric field may be reduced or prevented. The field plate 132 spans from the isolation structure 116 exposed by the opening OP to the gate structure 120 such that the intensity of the electric field below the opening OP (such as the intensity of the electric field near and at the impact ionization points of the isolation structure 116 below the opening OP) and the intensity of the electric field below the gate structure 120 may be reduced. Therefore, the injection of the electron-hole pairs (such as the electron-hole pairs generated from the impact ionization points of the isolation structure 116) into the gate structure 120, the field plate 118, or the source structure 124 due to the electric field may be reduced or prevented. In addition, the field plate 118 with the first portion 118a and the second portion 118b spaced apart from each other may improve electrical uniformity of the device. In these embodiments, the effect of hot carrier injection on the drain structure 122, the gate structure 120, the field plate 118, and the source structure 124 may be all alleviated, and thereby the reliability, lifetime, and overall performance of the device may be improved. In some embodiments, the drain structure 122 may be electrically connected to one ground terminal and/or the source structure 124 may be electrically connected to another ground terminal.

Figure 6:
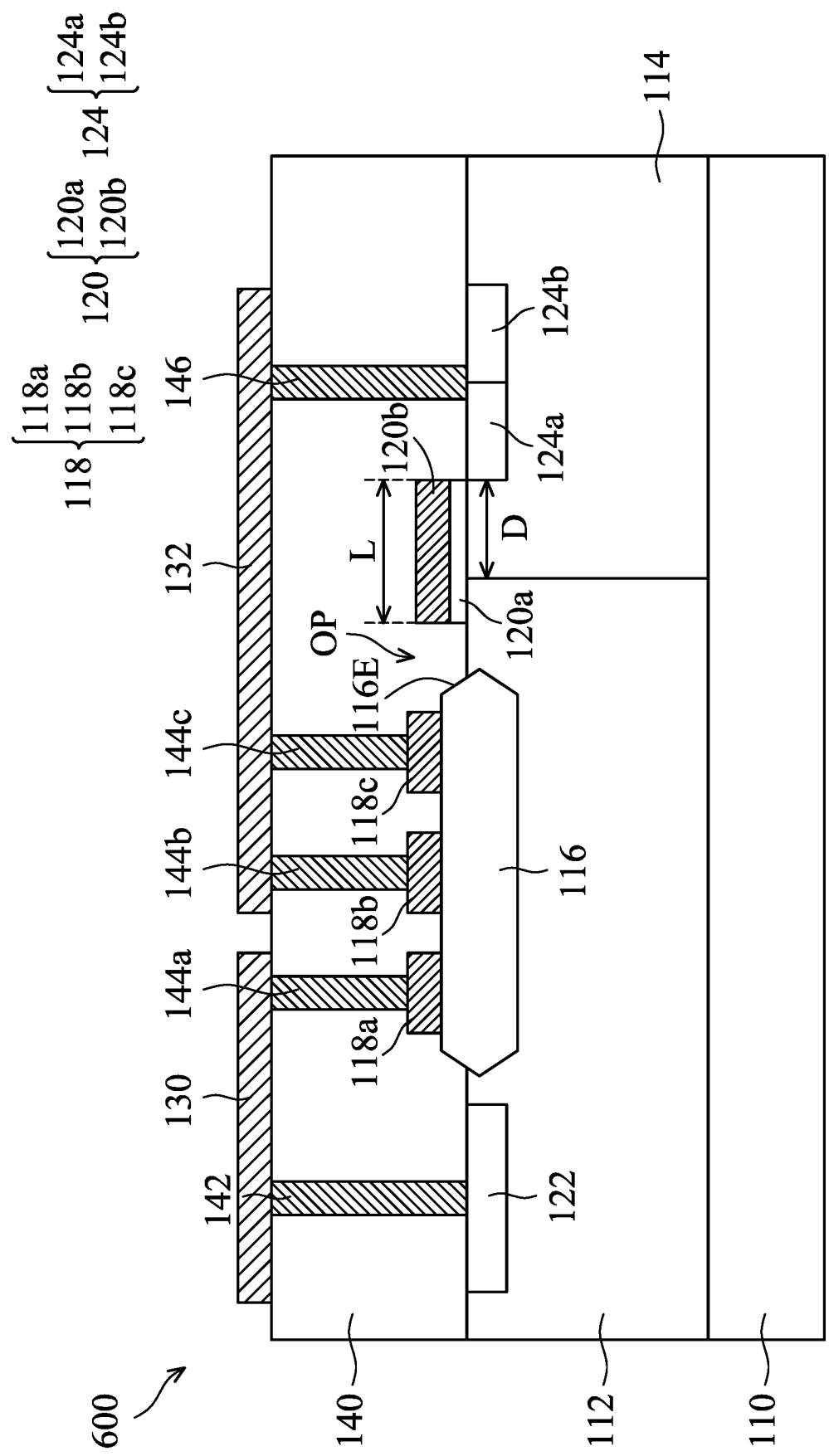

Those skilled in the art may adjust the configuration of the field plate 118 according to actual requirements. Referring to FIG. 6, which illustrates a cross-sectional view of the semiconductor device 600, in accordance with some embodiments of the present disclosure. The semiconductor device 600 is similar to the semiconductor device 500 in FIG. 5, except that the field plate 118 of the semiconductor device 600 has three portions spaced apart from each other, including the first portion 118a, the second portion 118b, and the third portion 118c. Portions of the isolation structure 116 are exposed among the three portions spaced apart from each other. For simplicity, like features in FIG. 6 and figures described above are designated with like reference numerals and the description is not repeated. The field plate 130 of the semiconductor device 600 is electrically connected to the first portion 118a of the field plate 118 and the drain structure 122 through the field plate contact 144a and the drain contact 142 respectively, and the field plate 132 is electrically connected to the second portion 118b, the third portion 118c, and the source structure 124 through the field plate contact 144b, the field plate contact 144c, and the source contact 146 respectively. In some embodiments, the field plate 118 having the first portion 118a, the second portion 118b, and the third portion 118c spaced apart from each other may be formed by a patterning process. As described above, in such embodiments, the effect of hot carrier injection on the drain structure 122, the gate structure 120, the field plate 118, and the source structure 124 may be all alleviated to prevent features from being damaged or deteriorated and improve overall performance of the device. Besides, through a patterning process, the number or spacing of the portions spaced apart from each other may be adjusted according to the design and function requirements such that the process of forming the device is flexible.

Figure 7:
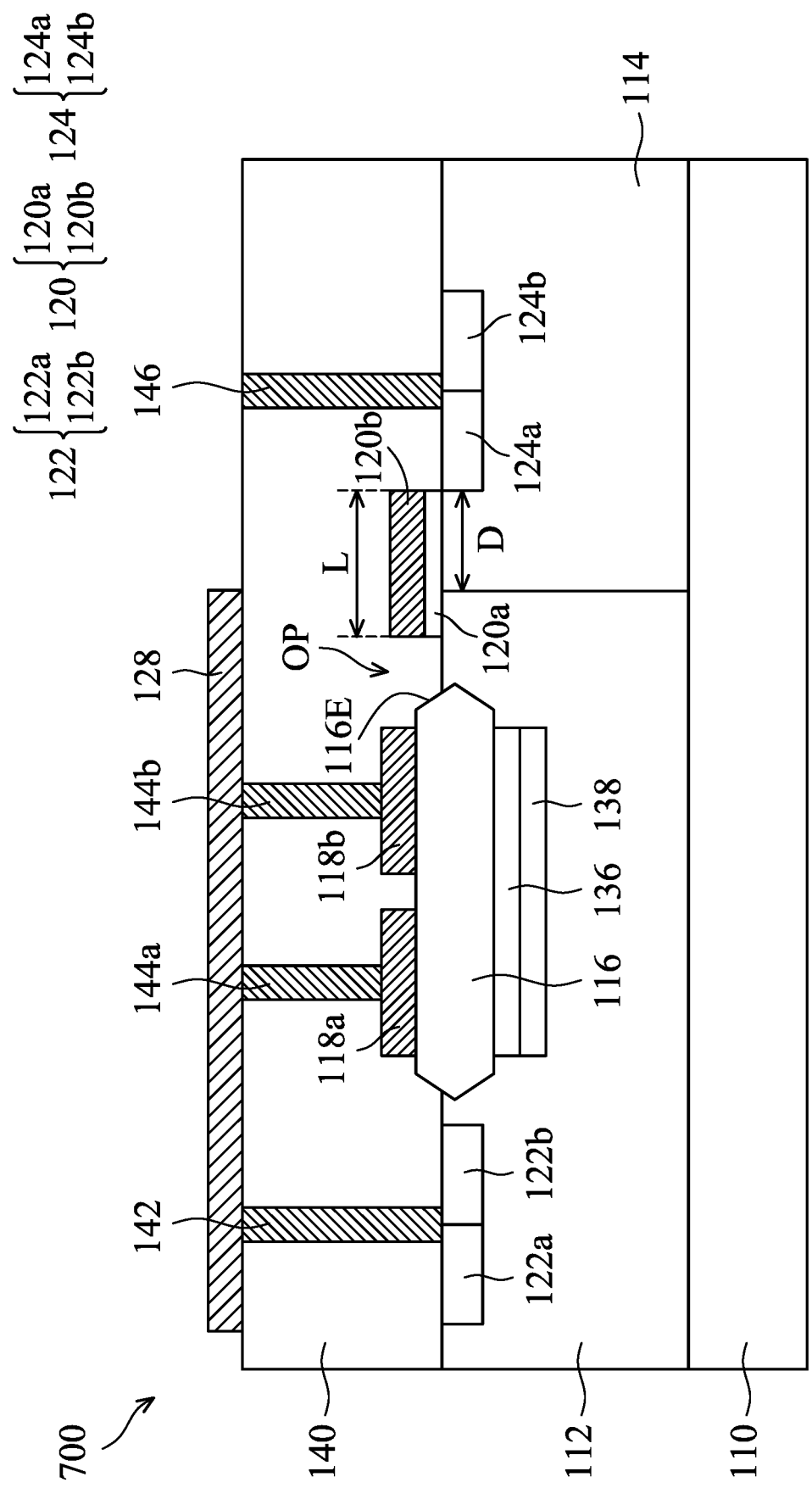

FIG. 7 illustrates a cross-sectional view of the semiconductor device 700, in accordance with some embodiments of the present disclosure. The semiconductor device 700 is similar to the semiconductor device 400 in FIG. 4, except that the semiconductor device 700 includes the doped regions 136 and 138, and the drain structure 122 includes the doped regions 122a and 122b having opposite conductivity types. For simplicity, like features in FIG. 7 and FIG. 4 are designated with like reference numerals and the description is not repeated. The doped region 136 is disposed below the isolation structure 116, and the doped region 138 is disposed below the doped region 136 and forms a junction with the doped region 136. The doped region 136 and the doped region 138 have opposite conductivity types. In some embodiments, the doped region 136 and the doped region 138 are formed by ion implantation. In such embodiments, at least one of the doped region 136 and the doped region 138 includes at least two sub-implant regions with different doping concentrations. In some embodiments, one of the sub-implant regions with a higher doping concentration is adjacent to the junction, and another one of the sub-implant regions with a lower doping concentration is distant from the junction. In such embodiments, in addition to reducing hot carrier injection as describe above, the doped region 136 and the doped region 138 of the semiconductor device 700 may be used to reduce the surface field of the isolation structure 116 such that the surface field may be uniform. The widths of the doped region 136 and the doped region 138 in FIG. 7 are merely examples. In some embodiments, the widths of the doped region 136 and the doped region 138 may be different from the width of the bottom portion of the isolation structure 116. In other embodiments, the width of the doped region 136 may be different from the width of the doped region 138.

Figure 8:
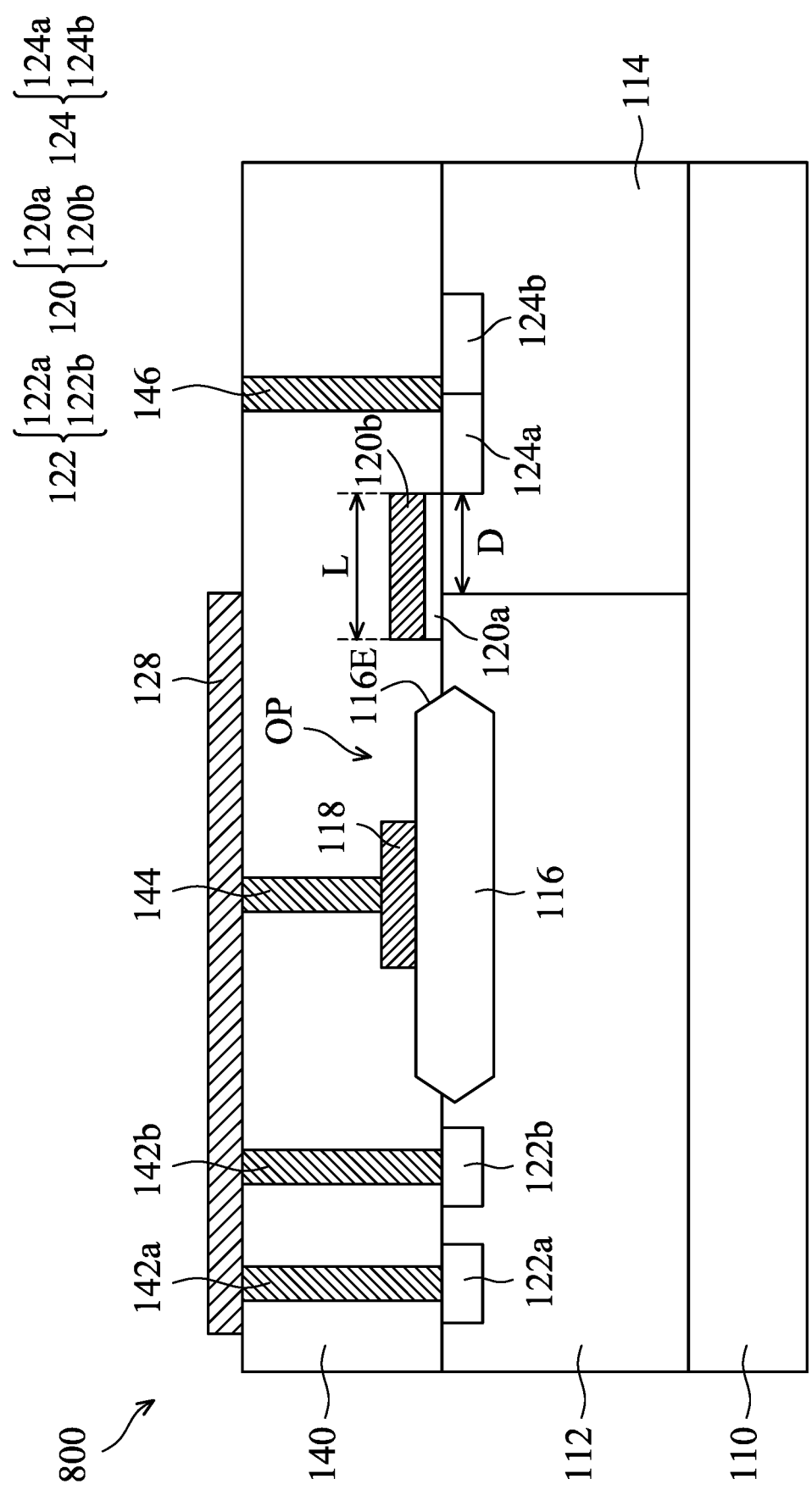

FIG. 8 illustrates a cross-sectional view of the semiconductor device 800, in accordance with some embodiments of the present disclosure. The semiconductor device 800 is similar to the semiconductor device 300 in FIG. 3, except that the drain structure 122 of the semiconductor device 800 includes the doped regions 122a and 122b with opposite conductivity types spaced apart from each other. The doped region 122a and the doped region 122b are electrically connected to the field plate 128 through the drain contact 142a and the drain contact 142b respectively. The material and method of forming the drain contacts 142a and 142b are the same as or similar to those of the drain contact 142 and not repeated. For simplicity, like features in FIG. 8 and FIG. 3 are designated with like reference numerals and the description is not repeated. In addition to reducing hot carrier injection as describe above, the embodiments may provide other benefits. For example, the current flowing in the drain contact 142b through the doped region 122b is increased since the doped region 122a and the doped region 122b are spaced apart from each other. Therefore, the voltage difference between the doped region 122b and the first well 112 is increased such that the semiconductor device 800 is quickly triggered. Furthermore, the trigger voltage of the semiconductor device 800 may be adjusted by varying the distance between the doped regions 122a and 122b. In other embodiments, the semiconductor device 800 may also include an optional doped region disposed between the isolation structure 116 and the doped region 122b, and the optional doped region is not connected to the drain contact 142a or 142b. The breakdown voltage of the semiconductor device 800 may be improved through the optional doped region.

A semiconductor device is provided in embodiments of the present disclosure, which includes an opening defined between the field plate on the isolation structure and the gate structure to expose the edge of the isolation structure. One of the objects is that the injection of the electron-hole pairs (such as the electron-hole pairs generated from the impact ionization points of the isolation structure) (i.e. hot carrier injection) into the overlying gate structure or field plate due to the electric field may be reduced or prevented to improve the reliability or lifetime of the device without affecting the breakdown voltage of the device. In some embodiments, the field plate on the isolation structure includes multiple portions spaced apart from each other that may improve electrical uniformity of the device. Furthermore, according to some embodiments of the present disclosure, one or more additional field plates are disposed and electrically connected to at least one of the source structure and the drain structure and to the field plate(s) on the isolation structure. One of the objects of the additional field plate(s) may further reduce the electric field(s) below the opening or the gate structure, between the isolation structure and the source structure, or between the isolation structure and the drain structure to reduce or prevent hot carrier injection and keep features from being damaged or deteriorated. The above description is only one of the purposes of the present disclosure and it is not intended to limit the scope of present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-voltage semiconductor device, comprising:
a substrate;
a first well and a second well adjoining each other and disposed in the substrate;
an isolation structure disposed on the first well;
a first field plate disposed on the isolation structure;
a gate structure crossing the first well and the second well, wherein an
opening is defined between the first field plate and the gate structure to expose a corner of the isolation structure adjacent to the gate structure;
a drain structure disposed in the first well;
a source structure disposed in the second well; and
a second field plate disposed over the first field plate and electrically connected to the first field plate and the source structure such that the first field plate, the second field plate, and the source structure have a same electric potential.

2. The high-voltage semiconductor device as claimed in claim 1, wherein the first field plate has a first portion and a second portion spaced apart from each other, and a portion of the isolation structure is exposed between the first portion and the second portion.

3. The high-voltage semiconductor device as claimed in claim 1, wherein the second field plate spans from the isolation structure exposed by the opening to at least a portion of the gate structure.

4. The high-voltage semiconductor device as claimed in claim 1, wherein the source structure or the drain structure is electrically connected to a ground terminal.

5. The high-voltage semiconductor device as claimed in claim 2, further comprising a third plate disposed over the first field plate, wherein the third field plate is electrically connected to the drain structure and the first portion of the first field plate, and the second field plate is electrically connected to the second portion of the first field plate.

6. The high-voltage semiconductor device as claimed in claim 5, wherein the third field plate spans from the isolation structure exposed by the opening to at least a portion of the gate structure.

7. The high-voltage semiconductor device as claimed in claim 5, wherein the drain structure is electrically connected to a ground terminal and the source structure is electrically connected to another ground terminal.

8. The high-voltage semiconductor device as claimed in claim 1, wherein the opening exposes a portion of the first well.

9. The high-voltage semiconductor device as claimed in claim 1, wherein the source structure comprises a first doped region and a second doped region adjoining each other and having opposite conductivity types.

10. The high-voltage semiconductor device as claimed in claim 9, further comprising a third doped region disposed below the source structure, wherein a doping concentration of the second doped region is greater than a doping concentration of the third doped region.

11. The high-voltage semiconductor device as claimed in claim 1, wherein the drain structure comprises a first doped region and a second doped region adjoining each other and having opposite conductivity types.

12. The high-voltage semiconductor device as claimed in claim 11, further comprising a third doped region disposed below the isolation structure, and a fourth doped region disposed below the third doped region and forming a junction with the third doped region, wherein the third doped region and the fourth doped region have opposite conductivity types.

13. The high-voltage semiconductor device as claimed in claim 11, wherein the first doped region and the second doped region are spaced apart by the first well.

14. The high-voltage semiconductor device as claimed in claim 1, further comprising:

an interlayer dielectric layer disposed on the substrate;
a drain contact penetrating through the interlayer dielectric layer and electrically connected to the drain structure; and
a source contact penetrating through the interlayer dielectric layer and electrically connected to the source structure.

15. The high-voltage semiconductor device as claimed in claim 1, wherein in a direction from the source structure to the isolation structure, a length of the gate structure is greater than a distance between the source structure and the first well.

16. The high-voltage semiconductor device as claimed in claim 1, wherein the first field plate has a first portion, a second portion, and a third portion spaced apart from each other, and portions of the isolation structure are exposed among the first portion, the second portion, and the third portion.

17. The high-voltage semiconductor device as claimed in claim 16, further comprising a third plate disposed over the first field plate, wherein the third field plate is electrically connected to the drain structure and the first portion of the first field plate, and the second field plate is electrically connected to the second portion and the third portion of the first field plate.

18. The high-voltage semiconductor device as claimed in claim 17, wherein the third field plate spans from the isolation structure exposed by the opening to at least a portion of the gate structure.

19. The high-voltage semiconductor device as claimed in claim 18, wherein the drain structure is electrically connected to a ground terminal and the source structure is electrically connected to another ground terminal.

* * * * *